United States Patent
Yamada et al.

(10) Patent No.: US 9,425,768 B2
(45) Date of Patent: Aug. 23, 2016

(54) RESONATOR ELEMENT, RESONATOR DEVICE, ELECTRONIC APPARATUS, MOVING OBJECT, AND METHOD OF MANUFACTURING RESONATOR ELEMENT

(71) Applicant: SEIKO EPSON CORPORATION, Tokyo (JP)

(72) Inventors: Akinori Yamada, Ina (JP); Shuhei Yoshida, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 44 days.

(21) Appl. No.: 14/313,637

(22) Filed: Jun. 24, 2014

(65) Prior Publication Data
US 2014/0375178 A1   Dec. 25, 2014

(30) Foreign Application Priority Data

Jun. 24, 2013  (JP) ................................ 2013-131937

(51) Int. Cl.
| | | |
|---|---|---|
| *H03H 9/21* | (2006.01) | |
| *H03H 9/215* | (2006.01) | |
| *H03H 9/05* | (2006.01) | |

(52) U.S. Cl.
CPC ............. *H03H 9/21* (2013.01); *H03H 9/0552* (2013.01); *Y10T 29/42* (2015.01)

(58) Field of Classification Search
CPC .. B06B 1/0659; G01C 19/5607; H03H 3/04; H03H 2003/026; H03H 2003/0492; H03H 9/21; H03H 9/215; H03H 9/2468; H03H 9/2473; H03H 9/2484; H03H 9/2494
USPC ........................................................ 310/370
See application file for complete search history.

(56) References Cited

U.S. PATENT DOCUMENTS

| | | | |
|---|---|---|---|
| 2001/0022488 A1 | 9/2001 | Kawauchi et al. | |
| 2007/0120449 A1* | 5/2007 | Aizawa .............. | G01C 19/5621 310/370 |
| 2010/0079036 A1* | 4/2010 | Iwai ...................... | H03H 9/215 310/348 |
| 2010/0207709 A1* | 8/2010 | Matsudo ................. | H03H 3/04 333/200 |
| 2013/0076211 A1* | 3/2013 | Arimatsu ............... | G04R 20/10 310/370 |
| 2015/0222245 A1* | 8/2015 | Ichikawa ................ | H03H 3/02 310/370 |

FOREIGN PATENT DOCUMENTS

| | | | | |
|---|---|---|---|---|
| EP | 2180596 A1 * | 4/2010 | ............. | H03H 3/04 |
| JP | A-2001-156584 | 6/2001 | | |
| JP | A-2001-332952 | 11/2001 | | |
| JP | A-2005-150992 | 6/2005 | | |
| JP | A-2005-151423 | 6/2005 | | |
| JP | A-2007-228431 | 9/2007 | | |
| JP | A-2008-22413 | 1/2008 | | |
| JP | A-2009-253622 | 10/2009 | | |
| JP | 2010050499 A * | 3/2010 | | |
| JP | A-2010-50499 | 3/2010 | | |
| JP | A-2013-78043 | 4/2013 | | |
| JP | A-2013-78044 | 4/2013 | | |
| JP | A-2013-78045 | 4/2013 | | |
| JP | A-2013-78046 | 4/2013 | | |

* cited by examiner

*Primary Examiner* — Jaydi San Martin
(74) *Attorney, Agent, or Firm* — Oliff PLC (57) ABSTRACT

A resonator element has a base part, vibrating arms having first principal surfaces and second principal surfaces in front-rear relationships with each other and extending from the base part, and side surfaces connected to the first principal surfaces and the second principal surfaces on ends of the vibrating arms, and the side surfaces are slopes having tilts with respect to perpendicular lines of the first principal surfaces or the second principal surfaces and provided from the first principal surfaces to the second principal surfaces, and crystal faces.

15 Claims, 10 Drawing Sheets

FIG. 12

RESONATOR ELEMENT, RESONATOR DEVICE, ELECTRONIC APPARATUS, MOVING OBJECT, AND METHOD OF MANUFACTURING RESONATOR ELEMENT

CROSS REFERENCE

The entire disclosure of Japanese Patent Application No. 2013-131937 filed Jun. 24, 2013 is expressly incorporated by reference herein.

BACKGROUND

1. Technical Field

The present invention relates to a resonator element and a resonator device, an electronic apparatus, and a moving object using the resonator element, and a method of manufacturing the resonator element.

2. Related Art

Electronic devices including thin vibrators and oscillators are widely used in small information apparatuses such as HDDs (hard disc drives), mobile computers, or IC cards, mobile communication apparatuses such as cell phones, car phones, or paging systems, etc. For example, in a piezoelectric vibrator as an electronic device disclosed in Patent Document 1 (JP-A-2008-22413), a tuning-fork crystal vibrating reed as a resonator element is mounted (connected) with vibrating arms floated within a package including a base part having a thin box shape and a lid member of a thin plate. In the piezoelectric vibrator having the configuration, when an impact is externally applied, the vibrating arms of the tuning-fork crystal vibrating reed may bend due to the impact, the ends of the vibrating arms may come into contact with the inner bottom surface of the package, and the vibrating arms may be broken.

To suppress the breakage of the vibrating arms, for example, in a piezoelectric vibrator disclosed in Patent Document 2 (JP-A-2009-253622), impact resistance is improved by providing cutout portions on the ends of the vibrating arms of the tuning-fork crystal vibrating reed. In the piezoelectric vibrator disclosed in Patent Document 2, even when the vibrating arms of the tuning-fork crystal vibrating reed bend due to an external impact or the like and the ends of the vibrating arms come into contact with the inner bottom surface of the package, the impact by the cutout portions (C-chamfers, R-chamfers, stepped portions) is dispersed, and prevention of breakage of the tuning-fork crystal vibrating reed may be expected.

However, polishing or grinding by machining is necessary for the C-chamfers and the R-chamfers provided on the ends of the vibrating arms of the piezoelectric vibrator disclosed in Patent Document 2. In the case of mass production, there is the first problem that large variations among individuals are caused in slope angles and shapes and stable predetermined chamfering with small variations is extremely difficult.

Further, in the pair of the vibrating arms, there is the second problem that a large difference is caused between the chamfered shapes of the arms.

Furthermore, in the case where weights are provided at the end sides of the vibrating arms, there is the third problem that breakage of the vibrating reed due to contact with the substrate on which the vibrating reed is mounted should be reduced while the weight effect is maintained.

In addition, it is necessary to newly add a step for the stepped portions or double-stepped portions provided on the ends of the vibrating arms of the piezoelectric vibrator, and there is the fourth problem of cost increase.

SUMMARY

An advantage of some aspects of the invention is to solve at least a part of the problems described above, and the invention can be implemented as the following forms or application examples.

Application Example 1

A resonator element according to this application example includes a base part, a vibrating arm having a first principal surface and a second principal surface in a front-rear relationship with each other and extending from the base part, and a side surface connected to the first principal surface and the second principal surface on an end of the vibrating arm, wherein the side surface is a slope having a tilt with respect to a perpendicular line of the first principal surface or the second principal surface and provided from the first principal surface to the second principal surface, and a crystal face.

According to this application example, the side surface on the end of the vibrating arm is the slope connecting the first principal surface and the second principal surface in the front-rear relationship with each other. The slope is the crystal face that may be easily formed when the outer shape of the resonator element is processed, and variations in shape and angle of the slope are reduced. Thereby, variations among individuals of the slopes may be easily reduced. Further, even when the vibrating arm bends due to an external impact or the like and the end of the vibrating arm comes into contact with a connected object, the side surface in contact is the slope and the corner part in contact has an obtuse angle, and thereby, the impact is dispersed and breakage of the resonator element may be prevented.

Application Example 2

In the resonator element according to the application example described above, it is preferable that the side surface is formed by over-etching of etching.

According to this application example, the slope on the end of the vibrating arm may be easily formed by over-etching (extending the etching time) when the outer shape of the resonator element is processed by etching. The slope is the crystal face and variations are harder to be caused in shape and angle and variations among individuals may be reduced. Thereby, the resonator elements having the slopes with the smaller variations among individuals may be stably provided.

Application Example 3

In the resonator element according to the application example described above, it is preferable that, supposing that an angle at which an extension of the slope and the first principal surface or the second principal surface intersect is θ, the tilt of the side surface falls within a range of 84 degrees≤θ≤88 degrees.

According to this application example, the smaller resonator element may be provided while reducing characteristic deterioration of the resonator element due to the difference in shape between the first principal surface and the second principal surface and maintaining electrical characteristics.

Application Example 4

In the resonator element according to the application example described above, it is preferable that a wider part is provided on the end of the vibrating arm, and the side surface is provided on an end of the wider part.

According to this application example, the breakage of the resonator element due to contact between the vibrating arm and the connected object may be prevented without extreme reduction of the weight effect of the wider part. In other words, impact resistance may be secured while downsizing of the resonator element by the weight effect is maintained.

Application Example 5

In the resonator element according to the application example described above, it is preferable that, supposing that an angle at which an extension of the slope and the first principal surface or the second principal surface intersect is θ, the tilt of the side surface falls within a range of 84 degrees≤θ≤88 degrees.

According to this application example, the resonator element that may reduce characteristic deterioration of the resonator element due to the difference in shape between the first principal surface and the second principal surface and maintain electrical characteristics while maintaining downsizing of the resonator element by the weight effect may be provided.

Application Example 6

In the resonator element according to the application example described above, it is preferable that a distance L between a connecting part of the slope to the first principal surface and a connecting part of the slope to the second principal surface satisfies a relationship of 0<L≤100 (μm) in a plan view.

According to this application example, the smaller resonator element that maintains electrical characteristics by reducing characteristic deterioration of the resonator element due to the difference in shape between the first principal surface side and the second principal surface side and has advantageous impact resistance may be provided.

Application Example 7

In the resonator element according to the application example described above, it is preferable that the distance L satisfies a relationship of 3<L≤10 (μm).

According to this application example, the resonator element having advantageous impact resistance while being further downsized may be provided.

Application Example 8

A resonator device according this application example includes the resonator element according to any one of the application examples described above, and a container including a lid body and a base, wherein the resonator element is mounted on the container.

According to this application example, the resonator element in which the connection angle of either principal surface and the side surface may be made larger by the slope connected to the first principal surface and the second principal surface is mounted on the container. Thereby, the resonator device having advantageous impact resistance in which, even when the vibrating arm bends due to an external impact or the like and the end of the vibrating arm comes into contact with the connected object, the impact is dispersed and breakage of the resonator element may be prevented may be provided.

Application Example 9

In the resonator device according to the application example described above, it is preferable that the slope of the resonator element tilts toward a smaller distance of a distance between the resonator element and the lid body and a distance between the resonator element and the base.

According to this application example, the electronic device realizing the lower height while maintaining impact resistance may be provided.

Application Example 10

A resonator device according this application example includes the resonator element according to any one of the application examples described above, and a circuit part.

According to this application example, impact resistance is advantageous and the resonator element and the circuit part for driving the resonator element are provided, and therefore, the resonator device advantageous in downsizing may be provided.

Application Example 11

An electronic apparatus according this application example includes the resonator element according to any one of the application examples described above.

According to this application example, the resonator element with reduced breakage due to an external impact or the like is used, and therefore, the electronic apparatus with improved resistance to the external impact may be provided.

Application Example 12

A moving object according this application example includes the resonator element according to any one of the application examples described above.

According to this application example, the resonator element with reduced breakage due to an external impact or the like is used, and therefore, the moving object with improved resistance to the external impact may be provided.

Application Example 13

A method of manufacturing a resonator element according this application example includes preparing a substrate, forming a mask corresponding to an outer shape of the resonator element on the substrate, and etching the substrate in a region exposed from the mask, wherein the etching includes etching for a longer time than the time in which the substrate is penetrated by etching.

According to this application example, the slope as the crystal face may be formed by the so-called over-etching of etching for the longer time than the time in which the substrate is penetrated by etching is performed, and therefore, increase in working man-hours including increase in the number of processing steps may be prevented.

BRIEF DESCRIPTION OF THE DRAWINGS

The invention will be described with reference to the accompanying drawings, wherein like numbers reference like elements.

FIGS. 1A to 1C are schematic diagrams showing a structure of a resonator element according to an embodiment.

FIGS. 2A and 2B are plan views showing an outline of the resonator element according to the embodiment, and FIG. 2A is a top view and FIG. 2B is a bottom view (perspective views).

FIGS. 7A and 7B are schematic diagrams showing a structure of a vibrator according to the invention.

DESCRIPTION OF EXEMPLARY EMBODIMENTS

As below, embodiments of the invention will be explained with reference to the accompanying drawings.

Resonator Element

Figure 1A:
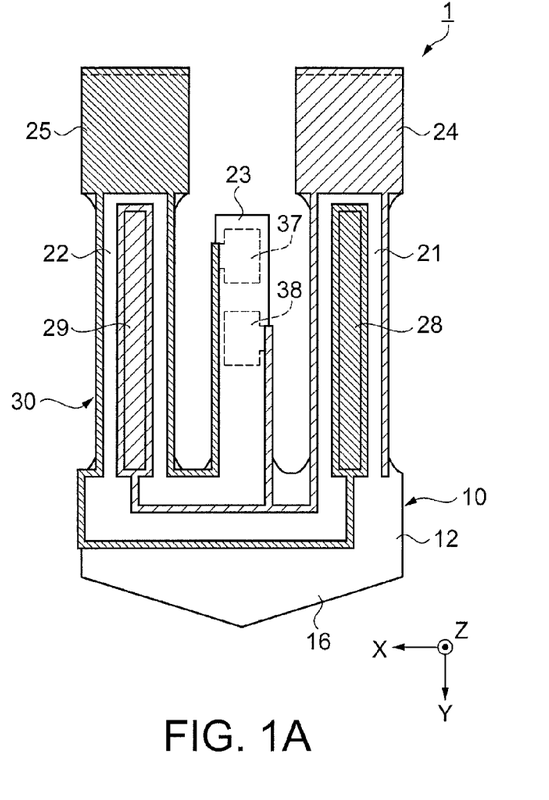
FIG. 1A is a plan view.
Figure 1B:
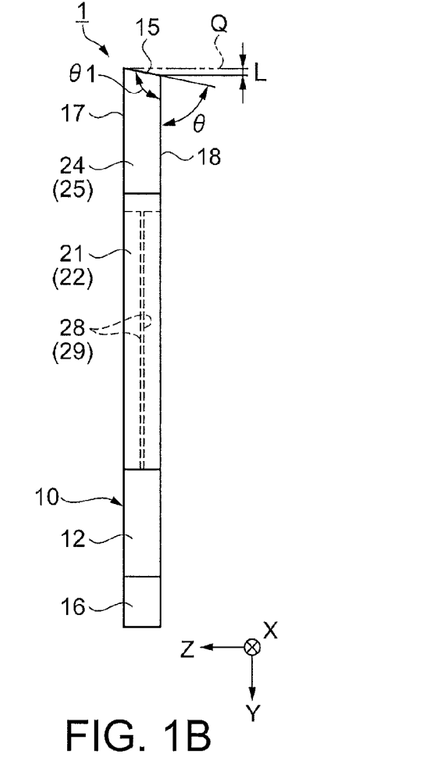
FIG. 1B is a side view.
Figure 1C:
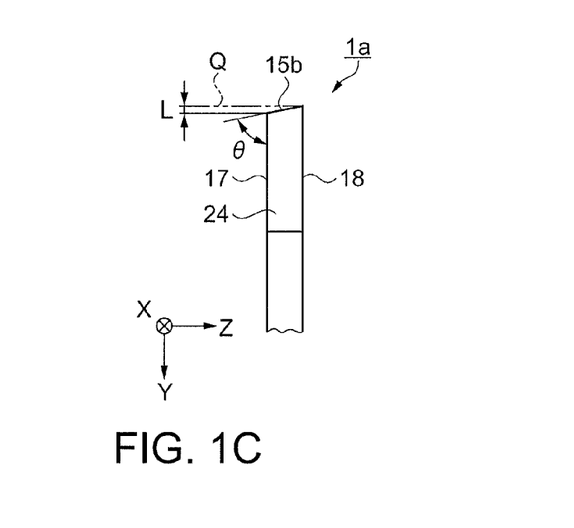
FIG. 1C is a side view showing a modified example of a slope.
Figure 2A:
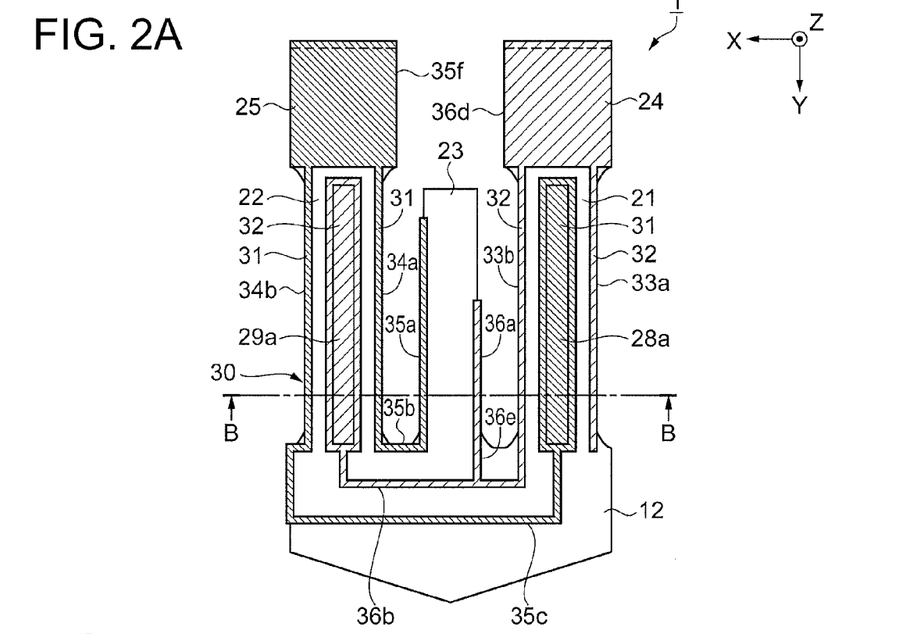
Figure 2B:
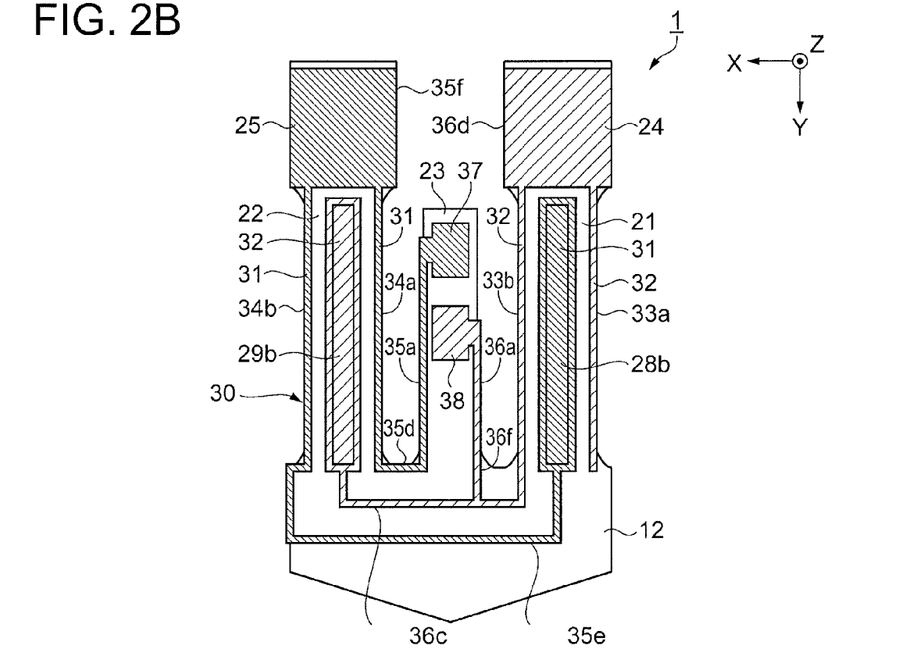
Figure 3:
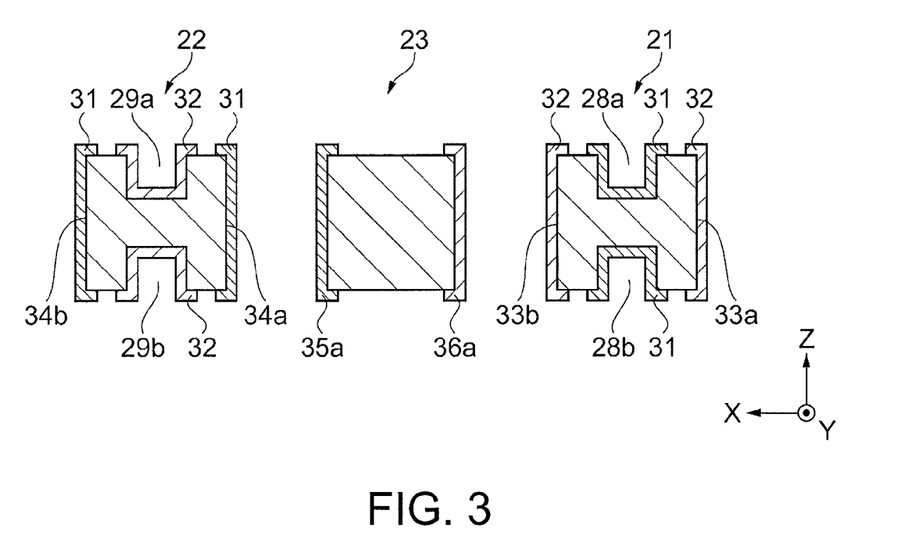
FIG. 3 shows an outline of the resonator element according to the embodiment, a sectional view along B-B line in FIG. 2A.
Figure 4:
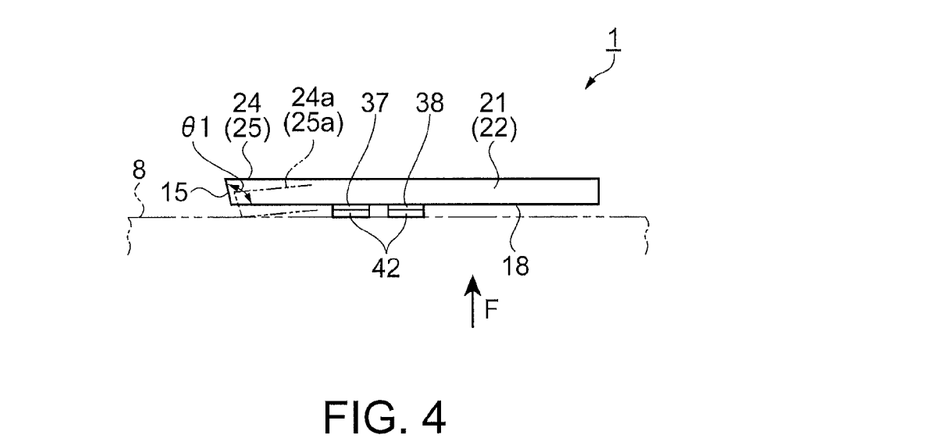
FIG. 4 is a front view for explanation of an action when the resonator element is subjected to an impact.

A resonator element according to an embodiment of the invention will be explained using FIGS. 1A to 6J. FIGS. 1A to 1C are schematic diagrams showing a structure of the resonator element according to the embodiment of the invention, and FIG. 1A is a plan view, FIG. 1B is a side view, and FIG. 1C is a side view showing a modified example of a slope. FIGS. 2A and 2B are plan views of the resonator element according to the embodiment of the invention, and FIG. 2A is a top view and FIG. 2B is a bottom view (perspective views). FIG. 3 is a sectional view along B-B line in FIG. 2A. FIG. 4 is a front sectional view for explanation of an action when the resonator element is subjected to an impact. FIGS. 5A to 6J are process flow diagrams for manufacturing the resonator element according to the embodiment. Note that, in the respective drawings, for convenience of explanation, an X-axis, a Y-axis, and a Z-axis are shown as three axes orthogonal to one another. Further, in the following explanation, for convenience of explanation, a plan view as seen from a direction along the Z-axis is simply referred to as "plan view". Furthermore, for convenience of explanation, in the plan view as seen from the Z-axis direction, the explanation will be made with a surface in the +Z-axis direction as an upper surface and a surface in the −Z-axis direction as a lower surface.

A resonator element 1 shown in FIGS. 1A to 1C has a substrate 10 including a base part 12 and vibrating arms 21, 22, and an electrode 30 for driving provided on the substrate 10. Note that the vibrating arms 21, 22 include arm parts connected to the base part and hammer heads (also referred to as wider parts or weight parts) 24, 25 having widths wider than the widths of the arm parts.

The substrate 10 is a crystal material, and is formed by quartz crystal, specifically, a Z-cut quartz crystal plate as a piezoelectric substrate, for example. Thereby, the resonator element 1 may exhibit advantageous vibration characteristics. The Z-cut quartz crystal plate is a crystal substrate having a thickness along the crystal Z-axis (optical axis) of the quartz crystal. It is preferable that the Z-axis is aligned with the thickness direction of the substrate 10, however, in view of reduction of frequency-temperature variation around the normal temperature, the Z-axis is slightly tilted (e.g., less than about 15° with respect to the thickness direction). The substrate 10 has the base part 12, the two vibrating arms 21, 22 projecting from the base part 12 in the −Y-axis direction and provided in parallel in the X-axis direction, and a support arm 23 projecting from the base part 12 in the −Y-axis direction and located between the two vibrating arms 21, 22.

The base part 12 has a nearly plate shape having a width in the XY-plane and a thickness in the Z-axis direction. The base part 12 of the embodiment has a narrower part 16 having a width continuously or discontinuously and gradually decreasing toward the +Y-axis direction on the opposite side to the vibrating arms 21, 22 and the support arm 23. The narrower part 16 is provided, and thereby, vibration leakage may be prevented. Note that the narrower part 16 may be provided as appropriate or omitted.

The vibrating arms 21, 22 are provided in parallel in the X-axis direction and respectively extend (project) from the base part 12 in the −Y-axis direction. Further, the hammer heads 24, 25 are provided on the ends of the vibrating arms 21, 22. The hammer heads 24, 25 are provided so that the resonator element 1 may be downsized and the frequencies of the flexural vibrations of the vibrating arms 21, 22 may be lowered. Note that the hammer heads 24, 25 may have pluralities of widths as appropriate.

In addition, the hammer heads 24, 25 as the weight parts are wider parts having the lengths along the X-axis direction longer than those of the arm parts, however, not limited to those as long as they have higher mass density per unit length than that of the arm parts. For example, the weight part may have a configuration in which the length is the same as that of the arm part along the X-axis direction and the thickness is larger than the that of the arm part along the Z-axis direction. Further, the weight part may be formed by providing a metal such as Au to be thicker on the surface of the arm part corresponding to the weight part. Furthermore, the weight part may be formed using a material having higher mass density than that of the arm part.

Side surfaces that connect first principal surfaces 17 on the front sides and second principal surfaces 18 on the rear sides are provided on the ends of the hammer heads 24, 25, i.e., on the ends of the vibrating arms 21, 22. The side surfaces include slopes 15 as crystal faces having tilts with respect to the perpendicular lines Q of the first principal surfaces 17 or the second principal surfaces 18. Note that, in the embodiment, the slopes 15 are provided over the first principal surfaces 17 and the second principal surfaces 18. That is, the slopes 15 are connected to the first principal surfaces 17 and the second principal surfaces 18. An etching method for corrosion of the substrate such as wet-etching enables formation of the slopes 15, and thereby, the slopes 15 may be easily formed.

Note that, in the resonator element 1 of the embodiment, the configuration in which the hammer heads 24, are provided on the ends of the vibrating arms 21, 22 is explained, however, the resonator element may have a configuration without the hammer heads 24, 25.

Note that, regarding the tilt of the slope 15, it is preferable that an angle θ formed by the second principal surface 18 and the extension of the slope 15, in other words, the angle θ formed by the second principal surface 18 located at the side toward which the slope 15 tilts and the extension of the slope 15 falls within the following range:

84 degrees≤θ≤88 degrees.

Accordingly, the tilts of the slopes 15 are set to be within the above described range, and thereby, breakage of the resonator element 1 due to contact between the hammer heads 24, 25 (vibrating arms 21, 22) with a connected object including the inner surface of the package, for example, may be prevented without extreme reduction of the weight effects of the hammer heads 24, 25. In other words, the resonator element 1 that may secure impact resistance while maintaining downsizing by the shortening of the vibrating arms 21, 22 by the weight effects may be provided.

Further, according to the configuration having the two vibrating arms 21, 22 projecting from the base part 12 in the −Y-axis direction like the substrate 10 of quartz crystal of the embodiment, the slopes 15 as the crystal faces at the above described angles may be easily formed on the ends of the vibrating arms 21, 22 (the ends of the hammer heads 24, 25) by over-etching when wet etching is performed depending on the cutout angle of the substrate 10 because of etching anisotropy of the crystal. Furthermore, the slopes 15 are the crystal faces that may be easily formed when the outer shape of the resonator element 1 is processed, and variations in shapes and angles of the slopes 15 are reduced. Thereby, variations among individuals of the slopes 15 may be reduced.

Further, it is preferable that, in the plan view as seen from the first principal surface 17, a distance L between the connecting part of the slope 15 to the first principal surface 17 and the connecting part of the slope 15 to the second principal surface 18 satisfies a relationship of 0<L≤100 (μm). The distance L is set to be in the range, and thereby, deterioration of electrical characteristics of the resonator element 1 due to the difference in shape between the first principal surface 17 side and the second principal surface 18 side may be suppressed, and the smaller resonator element 1 maintaining the electric characteristics and having the advantageous impact resistance may be provided.

Furthermore, it is preferable that the distance L satisfies a relationship of 3<L≤10 (μm). The distance L is set to be in the range, and thereby, the resonator element 1 having the advantageous impact resistance without reduction of the weight effects of the hammerheads 24, 25, in other words, while being downsized in addition to the above described advantage may be provided.

Moreover, grooves 28, 29 opening to the first principal surfaces 17 on the front sides and the second principal surfaces 18 on the rear sides and having bottoms are provided in the vibrating arms 21, 22. These grooves 28, 29 are provided to extend along the Y-axis direction and have the same shape with each other. Accordingly, the vibrating arms 21, 22 have cross-sectional shapes having nearly "H" shapes. The grooves 28, 29 are formed, and thereby, heat generated by flexural vibrations is harder to be diffused (thermal transfer) and, in an adiabatic region as a region having a flexural vibration frequency (mechanical flexural vibration frequency) f larger than the thermal relaxation frequency f0 (f>f0), a thermoelastic loss may be suppressed. Note that the grooves 28, 29 may be provided as appropriate or omitted.

The support arm 23 as a supporting part extends from the base part 12 in the −Y-axis direction and located between the vibrating arms 21, 22. Further, the support arm 23 has a longitudinal shape and a width (the length in the X-axis direction) nearly constant over the whole range in the longitudinal direction. Furthermore, on the support arm 23, first, second conducting pads 37, 38 are provided on the lower surface (the second principal surface 18 on the rear side) of the support arm 23. The shape (specifically, the shape in the plan view) of the support arm 23 is not particularly limited, but may have a part changing in width in the middle in the longitudinal direction.

Thus far, the configuration of the resonator element 1 has been briefly explained. Next, the electrode 30 provided on the substrate 10 will be explained. FIGS. 2A and 2B are the plan views showing an electrode configuration of the resonator element according to the first embodiment of the invention, and FIG. 2A is the top view and FIG. 2B is the bottom view (perspective views). Further, FIG. 3 is the sectional view along B-B line in FIG. 2A.

As shown in FIGS. 2A to 3, the electrode 30 has a plurality of first drive electrodes 31, the first conducting pad 37, interconnections 35a, 35b, 35c, 35d, 35e, 35f connecting the plurality of first drive electrodes 31 and the first conducting pad 37, a plurality of second drive electrodes 32, the second conducting pad 38, and interconnections 36a, 36b, 36c, 36d, 36e, 36f connecting the plurality of second drive electrodes 32 and the second conducting pad 38.

The first drive electrodes 31 are provided on the inner surfaces of the respective grooves 28a, 28b of the vibrating arm 21 and respective side surfaces 34a, 34b of the vibrating arm 22. The first drive electrode 31 of the groove 28a is connected to the first drive electrode 31 of the side surface 34b via the interconnection 35c provided over the upper surface (first principal surface 17) and the side surface of the base part 12, and the first drive electrode 31 of the groove 28b is connected to the first drive electrode 31 of the side surface 34b via the interconnection 35e provided over the lower surface (second principal surface 18) and the side surface of the base part 12. Note that the interconnections 35c, 35e are connected on the side surface of the base part 12. Further, the first drive electrode 31 of the side surface 34b is connected to the first drive electrode 31 of the side surface 34a via the interconnection 35f provided on the hammer head 25. Furthermore, the first drive electrode 31 of the side surface 34a is connected to the interconnection 35a provided on the side surface of the support arm 23 via the interconnection 35b and the interconnection 35d provided on the upper surface and the lower surface of the base part 12. Moreover, the interconnection 35a is electrically connected to the first conducting pad 37 provided on the lower surface of the support arm 23.

On the other hand, the second drive electrodes 32 are provided on the inner surfaces of the respective grooves 29a, 29b of the vibrating arm 22 and respective side surfaces 33a, 33b of the vibrating arm 21. The second drive electrode 32 of the groove 29a is connected to the second drive electrode 32 of the side surface 33b via the interconnection 36b provided on the upper surface of the base part 12, and the second drive electrode 32 of the groove 29b is connected to the second drive electrode 32 of the side surface 33b via the interconnection 36c provided on the lower surface of the base part 12. Further, the second drive electrode 32 provided on the side surface 33b is connected to the second drive electrode 32 provided on the side surface 33a via the interconnection 36d provided on the hammer head 24. Furthermore, the interconnection 36b on the upper surface of the base part 12 is connected via the interconnection 36e provided on the upper surface of the base part 12 and the interconnection 36c on the lower surface of the base part 12 is connected via the interconnection 36f provided on the lower surface of the base part 12 respectively to the interconnection 36a provided on the side surface of the support arm 23. Moreover, the interconnection 36a is electrically connected to the second conducting pad 38 provided on the lower surface of the support arm 23.

Thereby, drive voltages are applied from the first, second conducting pads 37, 38 to the first, second drive electrodes 31, 32 through the respective interconnections, and thereby, electric fields are appropriately generated within the vibrating arms of the resonator element and the two vibrating arms 21, 22 vibrate to repeat coming closer to each other and separating away from each other nearly in in-plane directions (in XY-plane directions) at a predetermined frequency. As a constituent material of the electrode 30, not particularly limited, but a metal material including, e.g., gold (Au), a gold alloy, platinum (Pt), aluminum (Al), an aluminum alloy, silver (Ag), a silver alloy, chromium (Cr), a chromium alloy, copper (Cu), molybdenum (Mo), niobium (Nb), tungsten (W), iron (Fe), titanium (Ti), cobalt (Co), zinc (Zn), and zirconium (Zr) and a conducting material including indium tin oxide (ITO) may be used.

Modified Example of Slope

Here, a modified example of the slope will be explained with reference to FIG. 1C. FIG. 1C is the side view showing the modified example of the slope. As shown in FIG. 1C, in a resonator element 1a of the modified example, the first principal surface 17 and the second principal surface 18 are located in the opposite directions compared to the resonator element 1 of the above described embodiment. In other words, a slope 15b is provided to tilt toward the first principal surface 17 side.

The slope 15b of the modified example connects the first principal surface 17 on the front side and the second principal surface 18 on the rear side, and has a tilt with respect to the perpendicular line Q of the first principal surface 17 or the second principal surface 18. Further, the slope 15b is provided over the first principal surface 17 and the second principal surface 18. That is, the slope 15b is connected to the first principal surface 17 and the second principal surface 18. With the slope 15b, a method of wet etching or the like may be used and the slope 15b may be easily formed.

Note that, regarding the tilt of the slope 15b, like the above described embodiment, it is preferable that an angle θ formed by the first principal surface 17 and the extension of the slope 15b, in other words, the angle θ formed by the first principal surface 17 located at the side toward which the slope 15b tilts and the extension of the slope 15b falls within the following range:

84 degrees≤θ≤88 degrees.

Accordingly, the tilts of the slopes 15b are set to be within the above described range, and thereby, the same advantage as that of the embodiment may be obtained.

Further, the distance L between the connecting part of the slope 15b to the first principal surface 17 and the connecting part of the slope 15b to the second principal surface 18 is the same as that of the above described embodiment, and the explanation here is omitted.

Method of Manufacturing Resonator Element

Thus far, the configuration of the resonator element has been explained. The resonator element 1 may be manufactured in the following manner. As below, a method of manufacturing the resonator element 1 will be explained along the process flow diagrams shown in FIGS. 5A to 5E and FIGS. 6F to 6J. Note that FIGS. 5A to 6J show an outer shape etching process. Further, the manufacturing method to be explained as below is just an example, and the resonator element 1 may be manufactured using another manufacturing method.

FIGS. 5A to 6J are process diagrams for explanation of an example of the method of manufacturing the resonator element 1, and the respective steps in FIGS. 5A to 6J are shown in the order of steps with respect to the region corresponding to the sections of the vibrating arms 21, 22 along the B-B cut line in FIG. 2A. Further, in the drawings, the support arm 23 is omitted.

Preparation Step of Substrate

Figure 5A:
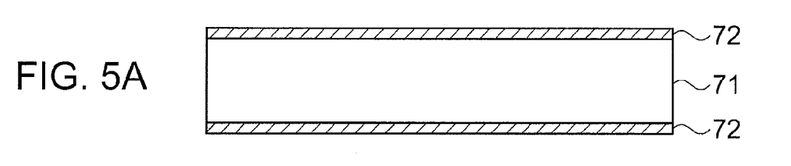
FIGS. 5A to 5E are process flow diagrams for manufacturing the resonator element according to the embodiment.

In FIG. 5A, a substrate 71 of a piezoelectric material having a size from which a plurality or a number of resonator elements 1 may be separated is prepared. In this regard, in the case of a tuning-fork resonator element 1 according to the progress of the process, the substrate 71 is cut out from a piezoelectric material, for example, quartz crystal of single-crystal so that the crystal X-axis shown in FIGS. 1A and 1B may be the electrical axis, the crystal Y-axis may be the mechanical axis, and the crystal Z-axis may be the optical axis. Further, when the substrate is cutout from the quartz crystal of single-crystal, in the orthogonal coordinate system of the above described crystal X-axis, crystal Y-axis, and crystal Z-axis, the XY-plane of the X-axis and the Y-axis is tilted to about −6 degrees or +6 degrees around the X-axis.

Forming Step of Corrosion-Resistant Films

As shown in FIG. 5A, corrosion-resistant films 72 are formed on the surfaces (front and rear surfaces) of the substrate 71 using a method of sputtering or evaporation. As illustrated, the corrosion-resistant films 72 are formed on both of the front and rear surfaces of the substrate 71 of crystal, and the corrosion-resistant films 72 include chromium layers as foundation layers and gold coating layers thereon, for example.

Note that, at the following steps, the same processing is performed on both of the upper and lower surfaces of the substrate 71, and only the upper surface will be explained for avoidance of complication.

Patterning Step of Outer Shape

Figure 5B:
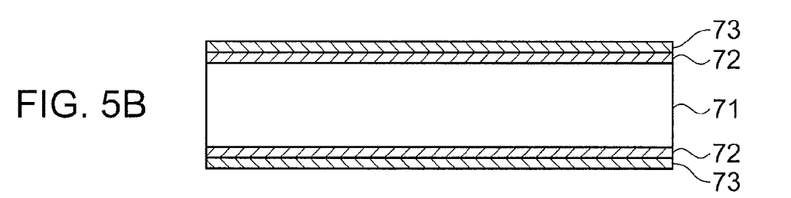

Then, as shown in FIG. 5B, for outer shape patterning, resists 73 are applied to the entire surfaces of the corrosion-resistant films 72 on the front and the rear of the substrate 71 (resist application step). As the resists 73, for example, ECA or PGMEA positive resists may be preferably used. Note that the forming step of the corrosion-resistant films and the patterning step of the outer shape correspond to a step of forming masks.

Wet-Etching Step

Figure 5C:
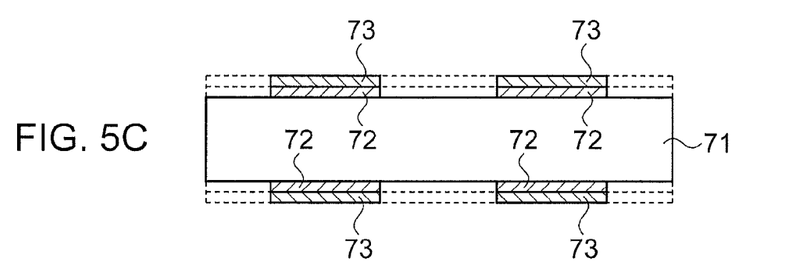

Then, as shown in FIG. 5C, masks having predetermined pattern widths (not shown) are placed for outer shape patterning, exposed to light, and then, the exposed resists 73 are removed and the corrosion-resistant films 72 are removed in correspondence with the removed resist parts in the order of Au, Cr.

Figure 5D:
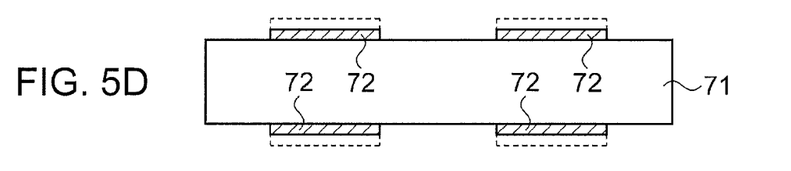
Figure 5E:
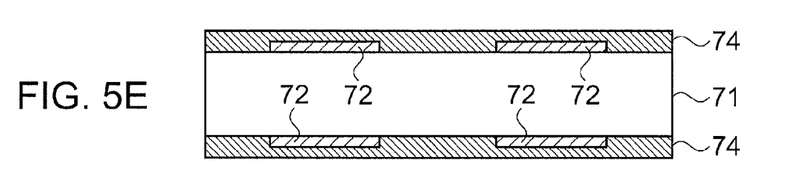

Then, as shown in FIG. 5D, the resists 73 on the corrosion-resistant films 72 are removed and the outer parts are exposed from the outer shapes of the resonator elements 1 as the regions covered by the corrosion-resistant films 72, and resists 74 are applied to the entire surfaces as shown in FIG. 5E.

Figure 6F:
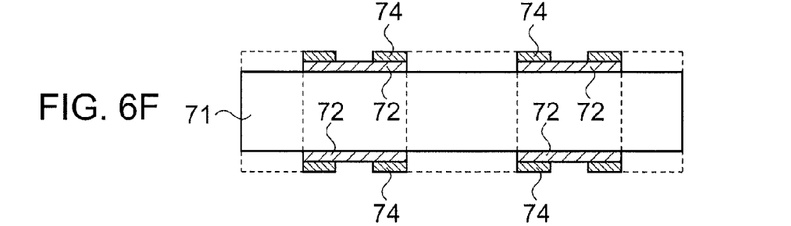
FIGS. 6F to 6J are process flow diagrams for manufacturing the resonator element according to the embodiment.

Then, as shown in FIG. 6F, the outer parts of the outer shapes of the resonator elements 1 and the resists 74 of the side groove parts of the respective vibrating arms are removed.

Figure 6G:
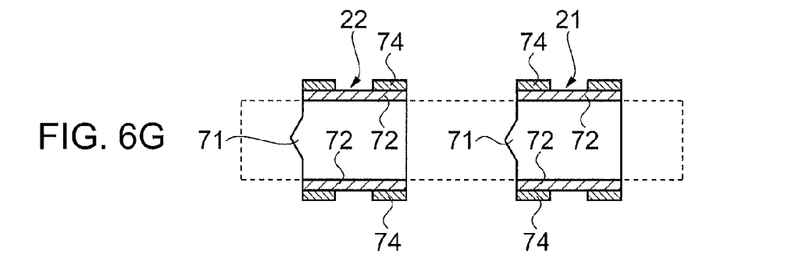

Then, as shown in FIG. 6G, with respect to the substrate 71 exposed as the outer parts from the outer shape of the resonator elements 1, for example, etching of the outer shape of the piezoelectric vibrating reeds is performed using a hydrofluoric acid solution as an etchant (hereinafter, also referred to as "etching step"). The etching step ends in two to three hours, and changes depending on the concentration, the type, the temperature, or the like of the hydrofluoric acid solution. In the embodiment, etching is performed using hydrofluoric acid and ammonium fluoride as an etchant under a condition of a concentration of 1:1 in volume ratio and a temperature of 65 degrees±1 degree (Celsius). When the etching is performed under the condition, the substrate 71 is penetrated in about thirty minutes. Then, over-etching is subsequently performed for about two hours, and thereby, etching residue produced in the +X-direction may be reduced and the crystal faces of the slopes 15 on the ends of the vibrating arms 21, 22 extending in the −Y-axis direction may be exposed. That is, the etching step is completed in about two and half hours.

Half-Etching Step

Figure 6H:
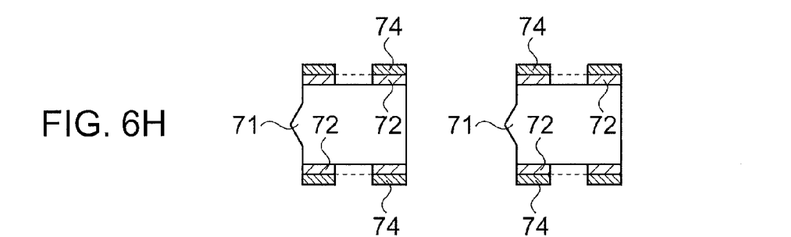

Then, as shown in FIG. 6H, the corrosion-resistant films 72 in the groove parts of the vibrating arms are removed.

Figure 6I:
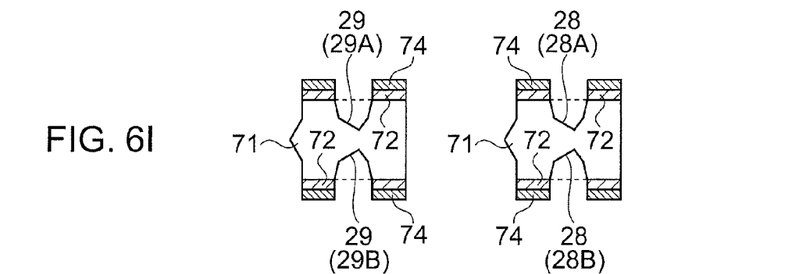

With respect to the substrates 71 exposed after removal of the corrosion-resistant films 72, further, as shown in FIG. 6I, half-etching of the grooves of the vibrating arms 21, 22 is performed using a hydrofluoric acid solution or the like.

In the embodiment, etching is performed using hydrofluoric acid and ammonium fluoride as an etchant under a condition of a concentration of 1:1 in volume ratio and a temperature of 65 degrees±1 degree (Celsius), and the etching step is completed in about thirty to sixty minutes.

Thereby, the first groove parts 28A, 29A and the second groove parts 28B, 29B of the vibrating arms 21, 22 are formed.

Figure 6J:
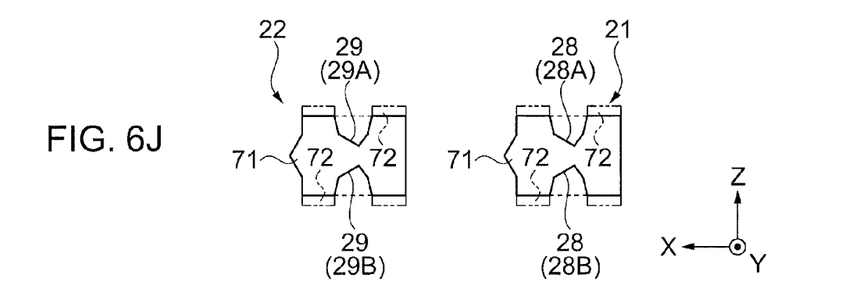

Then, as shown in FIG. 6J, the resists 74 are removed from the corrosion-resistant films 72 and the corrosion-resistant films 72 are removed. The state is a state without the electrode of the resonator element 1 shown in FIGS. 1A and 1B.

Subsequently, at the electrode forming step (not shown), metal films for forming electrodes on the entire surfaces are formed using a method of evaporation or sputtering. The metal films are excitation electrodes and include chromium layers as foundation layers and electrode layers (gold coating layers) thereon like the corrosion-resistant films.

Then, the application step of resists in electrode formation is performed, masking (not shown) for separating regions where the electrodes should be formed (see FIGS. 2A and 2B) and the other regions is performed and they are exposed to light, the unnecessary resists are removed, and the metal films to be removed are exposed. Then, the exposed metal films are removed by wet-etching using an etchant including potassium iodide, for example. Thereby, all of the metal films to be removed are removed. Finally, all of the unnecessary resists are separated.

In the above described manner, the resonator element 1 having the structure shown in FIGS. 1A to 3 is completed.

By using the above described manufacturing method, the so-called over-etching of etching for a longer time than the time in which the substrate 71 is penetrated by wet-etching is performed, and thereby, the slopes 15 as the crystal faces may be formed. Therefore, the slopes 15 may be easily formed without increasing the number of steps.

According to the above described resonator element 1, the angle θ at which the second principal surface 18 and the side surface connect may be made smaller by the slope 15 connected to the first principal surface 17 and the second principal surface 18. In other words, an inner angle θ1 as a connection angle of the corner part in which the slope 15 and the second principal surface 18 connect may be made larger.

The explanation will be made using the front view of FIG. 4. The resonator element 1 is connected to a connected object 8 as the package by the support arm 23 as the supporting part including the base part 12 so that the vibrating arms 21, 22 may be located in the air. When an external impact shown by an arrow F is applied to the cantilever-connected resonator element 1, the vibrating arms 21, 22 bend and the corner parts on the ends of the vibrating arms 21, 22 (hammer heads 24a, 25a shown by dashed-dotted lines in the drawing) may come into contact with the connected object 8. Even when the hammerheads 24a, 25a come into contact with the connected object 8, the inner angle θ1 as the connection angle of the corner part in which the slope 15 and the second principal surface 18 connect becomes larger to an obtuse angle, and thereby, the impact is dispersed and breakage of the resonator element 1 may be prevented.

Further, the slope 15 is the crystal face that may be easily formed when the outer shape of the resonator element 1 is processed, and variations in shape and angle of the slope 15 are reduced. Thereby, variations among individuals of the slope 15 may be reduced. Thereby, the smaller resonator element 1 may be provided while suppressing characteristic deterioration of the resonator element 1 due to the different in shape between the first principal surface 17 side and the second principal surface 18 side and maintaining the electrical characteristics.

The above described resonator element 1 is explained using the so-called tuning-fork resonator element including the two vibrating arms 21, 22 formed by the Z-cut quartz crystal plate as the piezoelectric substrate, however, the configuration of the resonator element is not limited to that. For example, the invention may be applied to a piezoelectric resonator element in which a piezoelectric material is provided on a silicon substrate or a sensor element that can measure acceleration, an angular velocity, pressure, or the like.

Vibrator

Figure 7A:
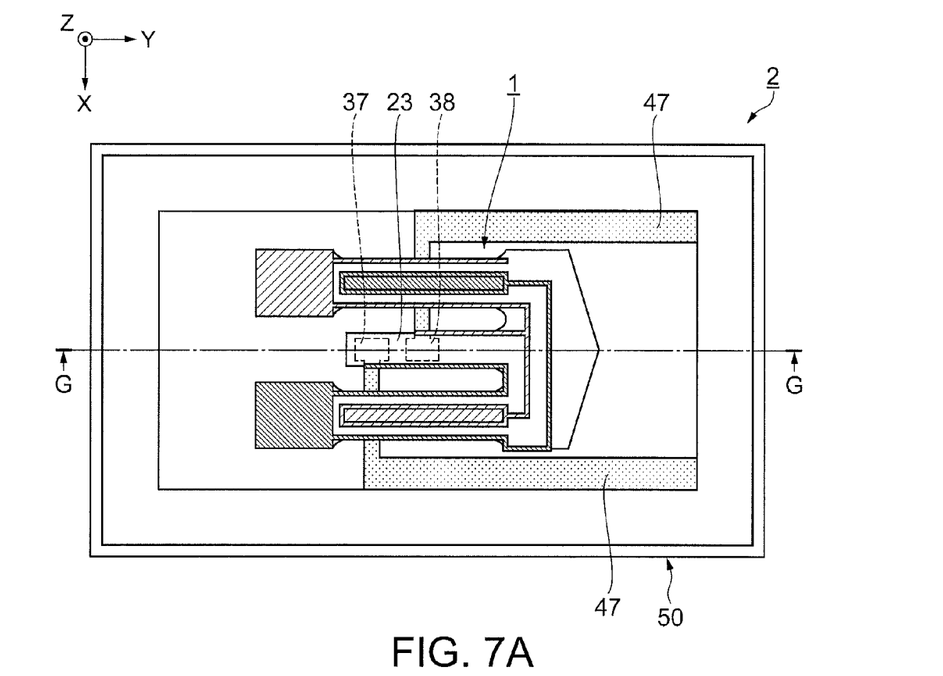
FIG. 7A is a plan view and FIG. 7B is a sectional view along G-G.
Figure 7B:
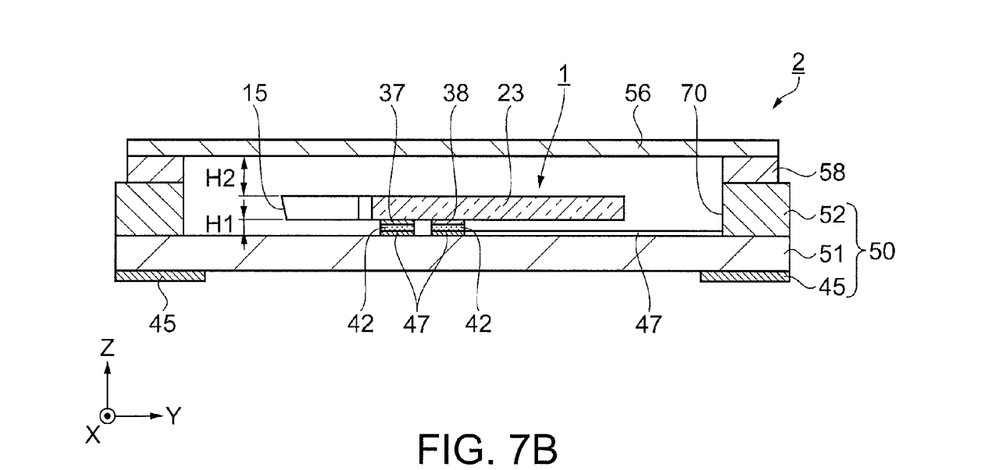

Next, a vibrator as an example of an electronic device to which the above described resonator element 1 according to the invention is applied will be explained using FIGS. 7A and 7B. FIGS. 7A and 7B are schematic diagrams showing a structure of a vibrator according to the invention, and FIG. 7A is a plan view of the vibrator and FIG. 7B is a sectional view along G-G in FIG. 7A. Note that, in FIG. 7A, for convenience of explanation of the internal configuration of the vibrator, a state with a lid member detached is shown.

A vibrator 2 includes the resonator element 1, a package main body 50 having a rectangular box shape for housing the resonator element 1, and a lid member 56 of glass, ceramics, or a metal. Note that the interior of a cavity 70 housing the resonator element 1 is a decompression space almost completely evacuated. Here, the package main body 50 corresponds to a base part and the cavity 70 corresponds to a container.

As shown in FIG. 7B, the package main body 50 is formed by stacking a first substrate 51, a second substrate 52, and mounting terminals 45 as shown in FIG. 7B. A plurality of the mounting terminals 45 are provided on the outer bottom surface of the first substrate 51. Further, a plurality of connecting electrodes 47 electrically conducted to the mounting terminals 45 are provided in predetermined positions on the upper surface of the first substrate 51 via through electrodes and interlayer connections (not shown). The second substrate 52 has an annular shape with a center part removed, and the cavity 70 for housing the resonator element 1 is provided therein.

The first substrate 51 and the second substrate 52 of the above described package main body 50 is formed using materials having insulation properties. The materials are not particularly limited, but, for example, various kinds of ceramics including oxide ceramics, nitride ceramics, and carbide ceramics may be used. Further, the respective electrodes, terminals provided in the package main body 50 and wiring patterns and interlayer connection patterns for electrically connecting them may be generally provided by screen-printing and baking of metal wiring materials of tungsten (W), molybdenum (Mo), or the like on insulating materials and plating of nickel (Ni), gold (Au), or the like thereon.

The lid member 56 as a lid body is preferably provided using a material that passes light, for example, borosilicate glass or the like and joined by a sealing material 58 to air-tightly seal the package main body 50. Thereby, after the package main body 50 is sealed by the lid, a laser beam is externally applied to the vicinity of the end of the resonator element 1 via the lid member 56 to partially transpire the electrodes provided here, and thereby, frequency adjustment by a mass reduction method may be made. Note that, in the case without the frequency adjustment, the lid member 56 may be formed by a metal material (lid) including a kovar alloy.

The resonator element 1 housed within the cavity 70 of the package main body 50 is joined via joining members 42 in alignment so that the first, second conducting pads 37, 38 provided on the support arm 23 may respectively correspond to the two connecting electrodes 47 provided on the upper surface of the first substrate 51 of the package main body 50. The joining members 42 may make electrical connection and mechanical joining using conducting joining members including bumps of a metal or solder and conducting adhesives, for example.

In the resonator element 1, it is preferable that the slopes 15 contained in the side surfaces on the ends of the hammer heads 24, 25 (see FIGS. 1A and 1B) are placed to face the upper surface side of the first substrate 51. In other words, it is preferable that the resonator element 1 is provided within the cavity 70 so that a distance H2 between the resonator element 1 and the lid member 56 may be larger than a distance H1 between the resonator element 1 and the upper surface of the first substrate 51. That is, the resonator element 1 is provided so that the slopes may tilt toward the smaller distance. The resonator element 1 is provided as described above, and, even when the distance H1 between the resonator element 1 and the upper surface of the first substrate 51 is smaller and the resonator element 1 bending due to an external impact comes into contact with the upper surface of the first substrate 51, the impact is dispersed because the inner angle θ1 of the corner part at which the slope 15 and the first principal surface 17 or the second principal surface 18 connect is an obtuse angle and the breakage of the resonator element 1 may be prevented. Thereby, the vibrator 2 as an electronic device that realizes improvement in impact resistance and the lower height may be provided.

Oscillator

Figure 8:
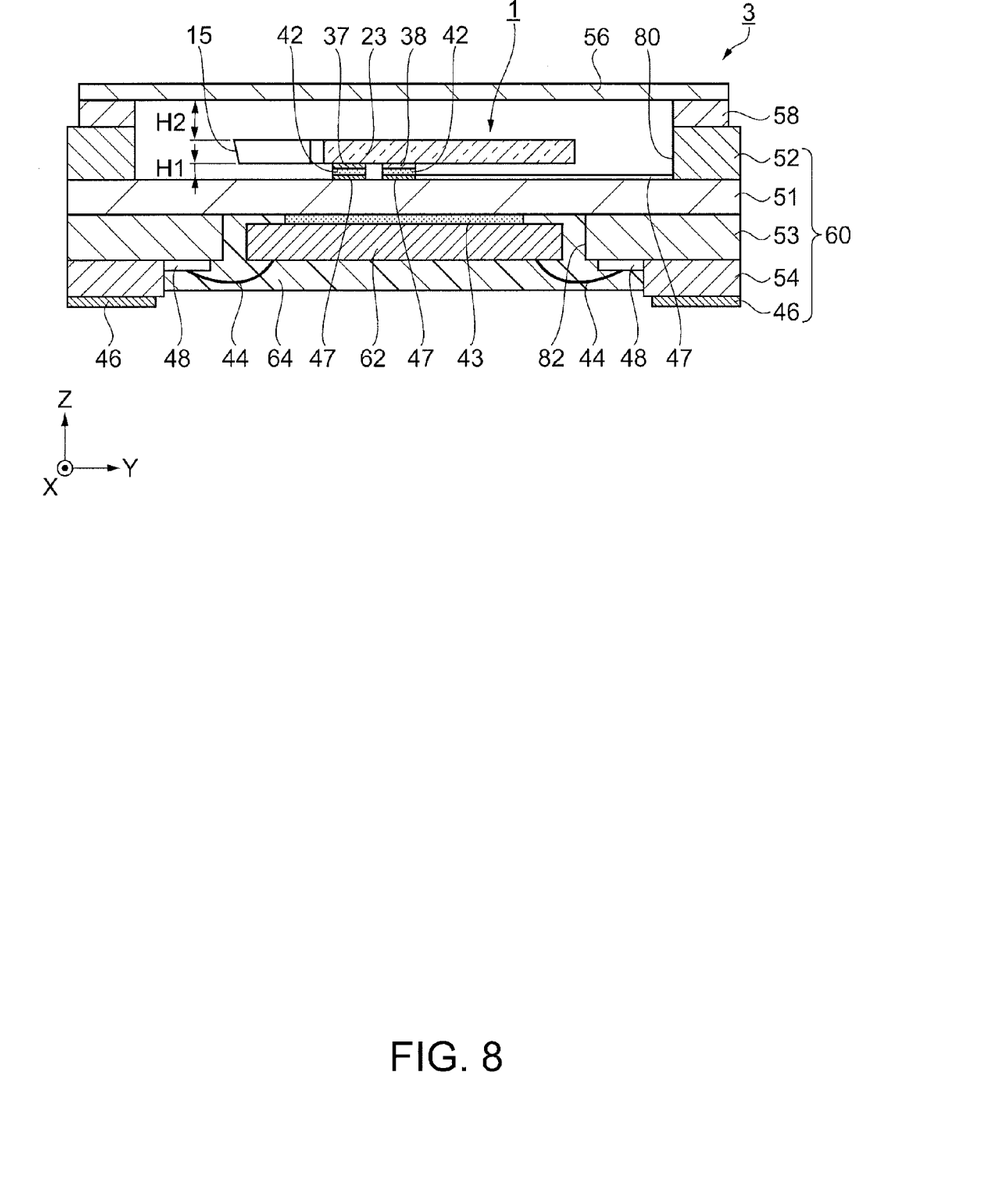
FIG. 8 is a front sectional view showing a schematic structure of an oscillator according to the invention.

Next, an oscillator as an example of the electronic device to which the above described resonator element 1 according to the invention is applied will be explained using FIG. 8. FIG. 8 is a front sectional view showing a schematic structure of an oscillator according to the invention.

An oscillator 3 includes the resonator element 1, a package main body 60 housing the resonator element 1, an IC chip (chip component) 62 for driving the resonator element 1, and a lid member 56 as a lid body of glass, ceramics, or a metal. Note that the interior of a first cavity 80 housing the resonator element 1 is a decompression space almost completely evacuated. Here, the package main body 60 corresponds to a base part and the first cavity 80 corresponds to a container.

The package main body 60 is formed by stacking a first substrate 51, a second substrate 52, a third substrate 53, a fourth substrate 54, and mounting terminals 46 as shown in FIG. 8. Further, the package main body 60 has the first cavity 80 opening to the upper surface and a second cavity 82 opening to the lower surface.

The resonator element 1 housed within the first cavity 80 of the package main body 60 is joined via joining members 42 in alignment so that the first, second conducting pads 37, 38 provided on the support arm 23 may respectively correspond to two connecting electrodes provided on the upper surface of the first substrate 51 of the package main body 60. The joining members 42 may use conducting joining members including bumps of a metal or solder and conducting adhesives, for example. Electrical connection and mechanical connection may be made using the joining members 42.

In the resonator element 1, it is preferable that the slopes 15 contained in the side surfaces on the ends of the hammer heads 24, 25 (see FIGS. 1A and 1B) are placed to face the upper surface side of the first substrate 51. In other words, it is preferable that the resonator element 1 is provided within the first cavity 80 so that a distance H2 between the resonator element 1 and the lid member 56 may be larger than a distance H1 between the resonator element 1 and the upper surface of the first substrate 51. That is, the resonator element 1 is provided so that the slopes may tilt toward the smaller distance. The resonator element 1 is provided as described above, and, even when the distance H1 between the resonator element 1 and the upper surface of the first substrate 51 is smaller and the resonator element 1 bending due to an external impact comes into contact with the upper surface of the first substrate 51, the impact is dispersed because the inner angle θ1 of the corner part at which the slope 15 and the first principal surface 17 or the second principal surface 18 connect is an obtuse angle and the breakage of the resonator element 1 may be prevented. Thereby, the oscillator 3 as an electronic device that realizes improvement in impact resistance and the lower height may be provided.

A plurality of mounting terminals 46 are provided on the outer bottom surface of the fourth substrate 54. Further, the mounting terminals 46 are electrically conducted to connecting terminals 47 provided on the upper surface of the first substrate 51 and connecting terminals 48 provided on the lower surface of the third substrate 53 via through electrodes and interlayer connections (not shown).

The first cavity 80 of the package main body 60 housing the resonator element 1 is joined to the lid member 56 via a sealing material 58 of borosilicate glass or the like, for example, and thereby, air-tightly sealed.

On the other hand, the IC chip 62 is housed within the second cavity 82 of the package main body 60, and the IC chip 62 is fixed to the lower surface of the first substrate 51 via a joining member 43 such as a brazing filler material or an adhesive agent. Further, at least two connecting electrodes 48 are provided within the second cavity 82. The connecting electrodes 48 are electrically connected to the IC chip 62 by bonding wires 44. Furthermore, the second cavity 82 is filled with a resin material 64 and the IC chip 62 is sealed by the resin material 64.

The IC chip 62 has a drive circuit (oscillator circuit) for controlling driving of the resonator element 1, and, when the resonator element 1 is driven by the IC chip 62, signals at a predetermined frequency may be extracted.

Electronic Apparatuses

Next, electronic apparatuses to which either of the vibrator 2 using the resonator element 1 or the oscillator 3 using the resonator element 1 will be explained in detail with reference to FIGS. 9 to 11. Note that, in the explanation, the examples applying the vibrators 2 are shown.

Figure 9:
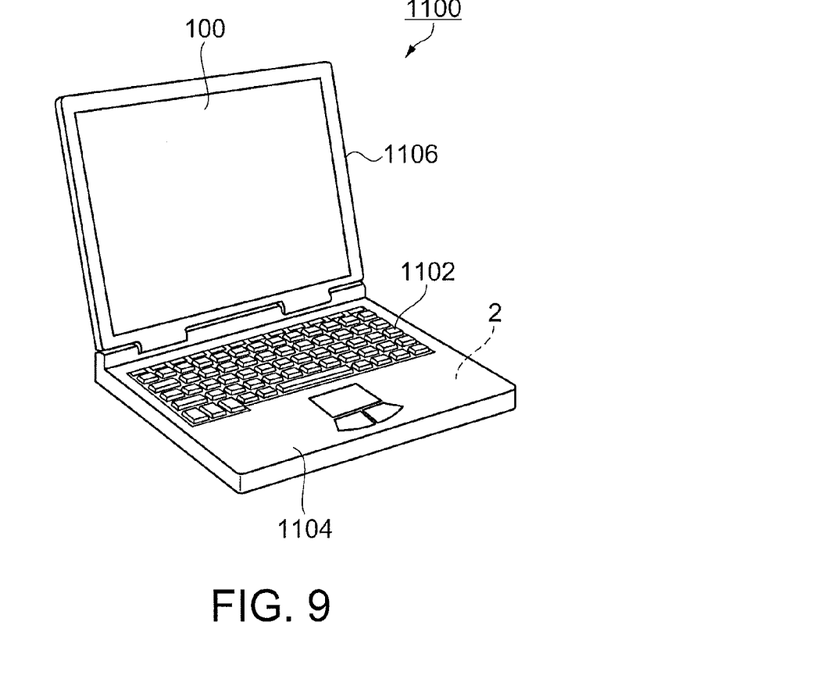
FIG. 9 is a perspective view showing a configuration of a mobile personal computer as an example of an electronic apparatus.

FIG. 9 is a perspective view showing an outline of a configuration of a mobile (notebook) personal computer as an electronic apparatus including the vibrator 2 as the electronic device according to one embodiment of the invention. In the drawing, a personal computer 1100 includes a main body unit 1104 having a keyboard 1102 and a display unit 1106 having a display part 100, and the display unit 1106 is rotatably supported via a hinge structure part with respect to the main body unit 1104. The personal computer 1100 contains the vibrator 2 having a function as a timing source of signal processing.

Figure 10:
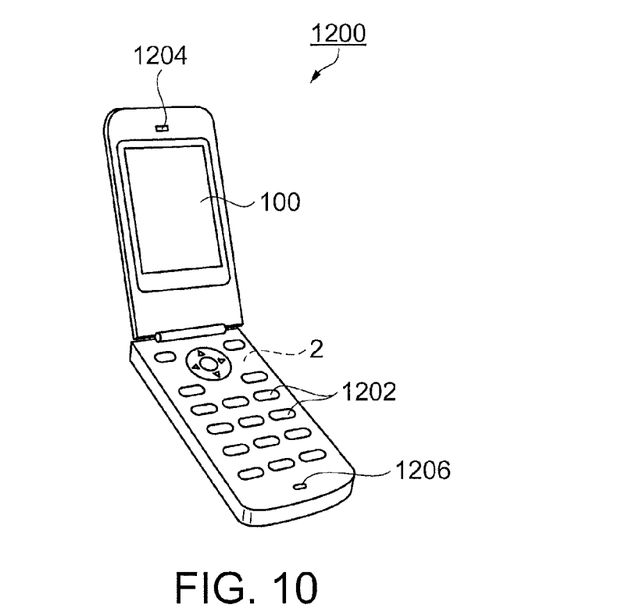
FIG. 10 is a perspective view showing a configuration of a cell phone as an example of the electronic apparatus.

FIG. 10 is a perspective view showing an outline of a configuration of a cell phone (including a PHS) as the electronic apparatus including the vibrator 2 as the electronic device according to one embodiment of the invention. In the drawing, a cell phone 1200 includes a plurality of operation buttons 1202, an ear piece 1204, and a mouthpiece 1206, and a display part 100 is provided between the operation buttons 1202 and the ear piece 1204. The cell phone 1200 contains the vibrator 2 having a function as a timing source of signal processing.

Figure 11:
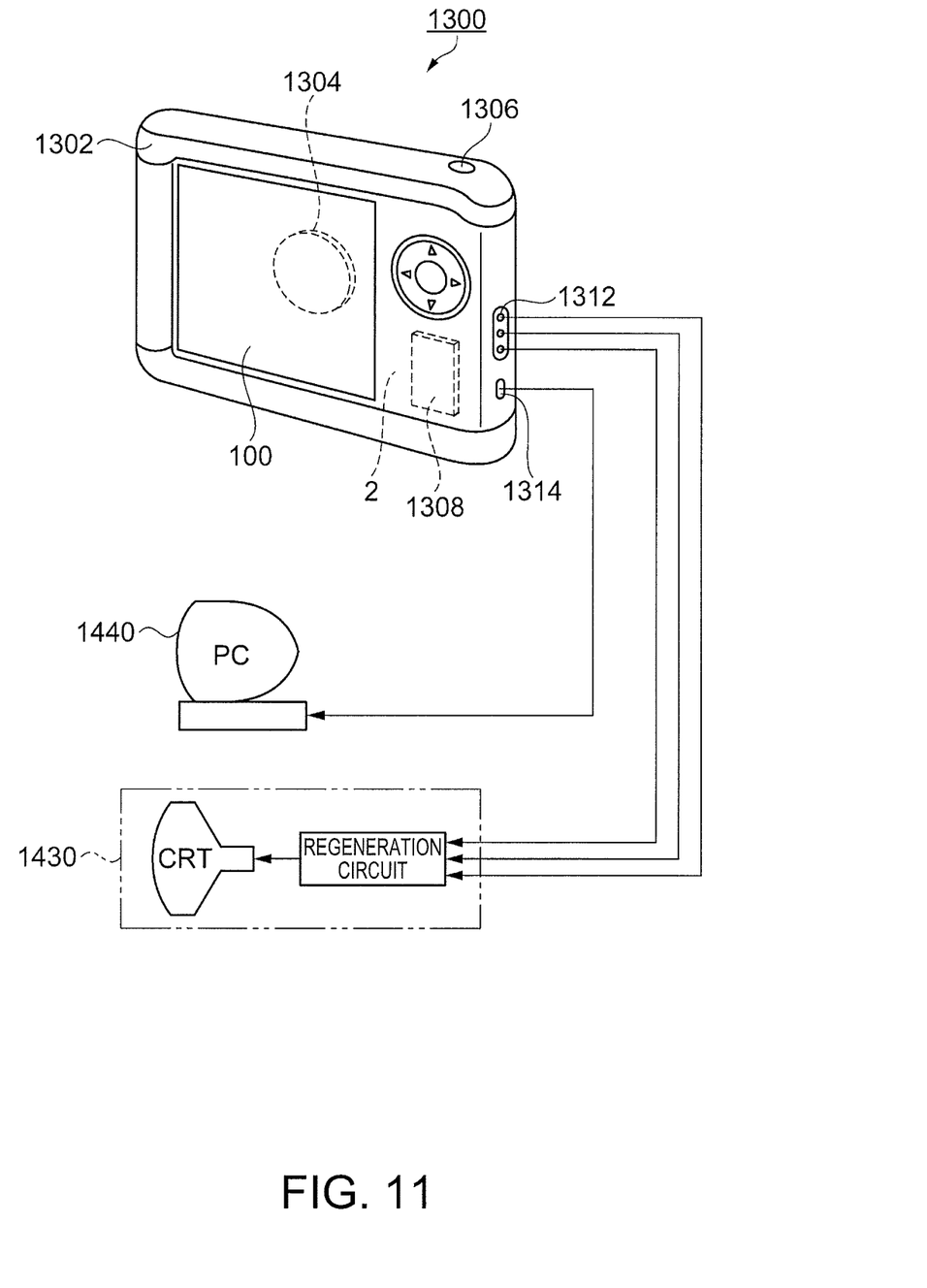
FIG. 11 is a perspective view showing a configuration of a digital still camera as an example of the electronic apparatus.

FIG. 11 is a perspective view showing an outline of a configuration of a digital still camera as the electronic apparatus including the vibrator 2 as the electronic device according to one embodiment of the invention. Note that, in the drawing, connection to an external device is simply shown. Here, in a camera of related art, a silver halide photographic film is exposed to light by an optical image of a subject and, on the other hand, a digital still camera 1300 photoelectrically converts an optical image of a subject using an image sensing device such as a CCD (Charge Coupled Device) and generates imaging signals (image signals).

On a back surface of a case (body) 1302 in the digital still camera 1300, a display part 100 is provided and adapted to display based on the imaging signals by the CCD, and the display part 100 functions as a finder that displays the subject as an electronic image. Further, on the front side (the rear side in the drawing) of the case 1302, a light receiving unit 1304 including an optical lens (imaging system), the CCD, etc. is provided.

When a photographer checks the subject image displayed on the display part 100 and presses down a shutter button 1306, the imaging signals of the CCD at the time are transferred and stored into a memory 1308. Further, in the digital still camera 1300, a video signal output terminal 1312 and an input/output terminal for data communication 1314 are provided on the side surface of the case 1302. Furthermore, as illustrated, a television monitor 1430 is connected to the video signal output terminal 1312 and a personal computer 1440 is connected to the input/output terminal for data communication 1314, respectively, as appropriate. In addition, by predetermined operation, the imaging signals stored in the memory 1308 are output to the television monitor 1430 and the personal computer 1440. The digital still camera 1300 contains the vibrator 2 having a function as a timing source of signal processing.

Note that the vibrator 2 as the electronic device according to one embodiment of the invention may be applied not only to the personal computer (mobile personal computer) in FIG. 9, the cell phone in FIG. 10, and the digital still camera in FIG. 11 but also to an electronic apparatus including an inkjet ejection device (for example, an inkjet printer), a laptop personal computer, a television, a video camera, a video tape recorder, a car navigation system, a pager, a personal digital assistance (with or without communication function), an electronic dictionary, a calculator, an electronic game machine, a word processor, a work station, a videophone, a security television monitor, electronic binoculars, a POS terminal, a medical device (for example, an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), a flight simulator, etc., for example.

Moving Object

Figure 12:
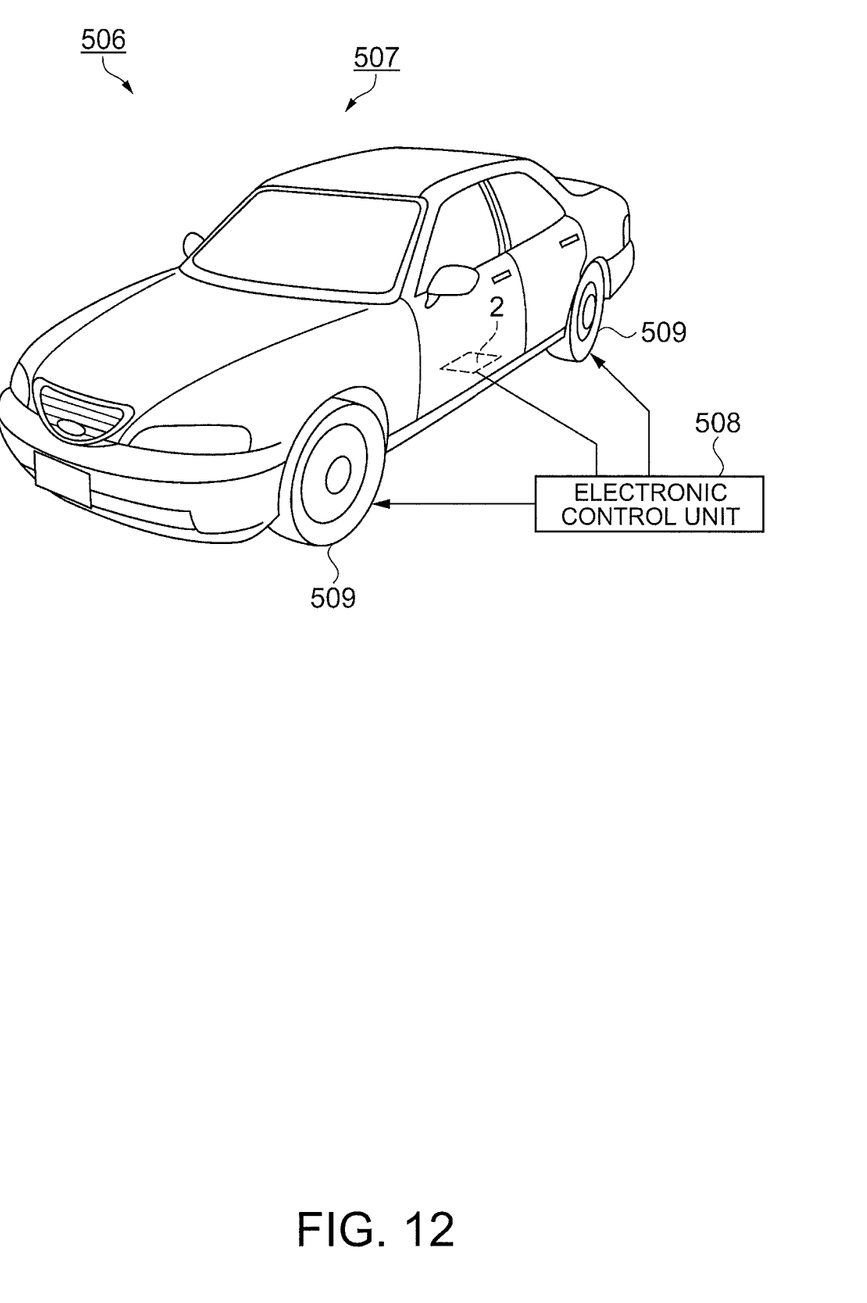
FIG. 12 is a perspective view showing a configuration of an automobile as an example of a moving object.

FIG. 12 is a perspective view schematically showing an automobile as an example of a moving object. On an automobile 506, the vibrator 2 as the electronic device according to the invention is mounted. For example, as shown in the drawing, in the automobile 506 as the moving object, an electronic control unit 508 that contains the vibrator 2 and controls tires 509 is mounted on a vehicle body 507. Further, the vibrator 2 may be widely applied to an electronic control unit (ECU) such as a keyless entry system, an immobilizer, a car navigation system, a car air-conditioner, an antilock brake system (ABS), an airbag, a tire pressure monitoring system (TPMS), an engine control, a battery monitor for hybrid cars and electric cars, or a vehicle attitude control system.

What is claimed is:

1. A resonator element comprising:
   a base part;
   a vibrating arm having a first principal surface and a second principal surface in a front-rear relationship with each other and extending from the base part, the vibrating arm including:
      a weight part; and
      an arm part provided between the weight part and the base part in a plan view, and
   a side surface connected between the first principal surface and the second principal surface on an end of the weight part,
   the side surface being sloped with a tilt with respect to a line perpendicular to the first principal surface or to the second principal surface and provided from the first principal surface to the second principal surface, and the side surface being a crystal face, the tilt of the side surface extending in a direction from the first principal surface to the second principal surface, and an angle θ at which an extension of the slope and the first principal surface or the second principal surface intersect falls within a range of 84 degrees ≤θ≤88 degrees.

2. The resonator element according to claim 1, wherein the side surface is formed by over-etching of etching.

3. The resonator element according to claim 1, wherein a distance L between a connecting part of the slope to the first principal surface and a connecting part of the slope to the second principal surface satisfies a relationship of 0<L ≤100 (μm).

4. The resonator element according to claim 3, wherein the distance L satisfies a relationship of 3<L ≤10 (μm).

5. A resonator device comprising:
the resonator element according to claim 1; and
a container including a lid body and a base,
wherein the resonator element is mounted on the container.

6. A resonator device comprising:
the resonator element according to claim 2; and
a container including a lid body and a base,
wherein the resonator element is mounted on the container.

7. The resonator device according to claim 5, wherein the slope of the resonator element tilts toward a smaller of a distance between the resonator element and the lid body and a distance between the resonator element and the base.

8. The resonator device according to claim 6, wherein the slope of the resonator element tilts toward a smaller of a distance between the resonator element and the lid body and a distance between the resonator element and the base.

9. A resonator device comprising:
the resonator element according to claim 1; and
a circuit.

10. A resonator device comprising:
the resonator element according to claim 2; and
a circuit.

11. An electronic apparatus comprising the resonator element according to claim 1.

12. An electronic apparatus comprising the resonator element according to claim 2.

13. A moving object comprising the resonator element according to claim 1.

14. A moving object comprising the resonator element according to claim 2.

15. A resonator element comprising:
a base part;
a vibrating arm having a first principal surface and a second principal surface in a front-rear relationship with each other and extending from the base part; and
a side surface connected between the first principal surface and the second principal surface on an end of the vibrating arm,
the side surface forming an obtuse angle with one of the first principal surface or the second principal surface, and the side surface being a crystal face.

* * * * *